US007829261B2

(12) United States Patent
Strehmel et al.

(10) Patent No.: US 7,829,261 B2
(45) **Date of Patent: *Nov. 9, 2010**

(54) METHOD FOR MAKING A LITHOGRAPHIC PLATE

(75) Inventors: Bernd Strehmel, Berlin (DE); Harald Baumann, Osterode/Harz (DE); Ulrich Fiebag, Nienstadt (DE); Tanja Ebhardt, Osterode (DE); Detlef Pietsch, Badenhausen (DE)

(73) Assignee: Kodak Graphic Communications GmbH, Sofia (BG)

( * ) Notice: Subject to any disclaimer, the term of this patent is extended or adjusted under 35 U.S.C. 154(b) by 297 days.

This patent is subject to a terminal disclaimer.

(21) Appl. No.: 11/573,916

(22) PCT Filed: Aug. 23, 2005

(86) PCT No.: PCT/US2005/029800

§ 371 (c)(1),
(2), (4) Date: Feb. 19, 2007

(87) PCT Pub. No.: WO2006/026230

PCT Pub. Date: Mar. 9, 2006

(65) Prior Publication Data

US 2007/0254238 A1 Nov. 1, 2007

(30) Foreign Application Priority Data

Aug. 30, 2004 (DE) ....................... 10 2004 041 942

(51) Int. Cl.
*B41N 1/00* (2006.01)
*G03F 7/00* (2006.01)
*G03F 7/26* (2006.01)

(52) U.S. Cl. .................... 430/309; 101/463.1; 101/453; 430/270.1; 430/281.1; 430/286.1; 430/287.1; 430/300; 430/302

(58) Field of Classification Search ............. 430/270.1, 430/300, 302, 331
See application file for complete search history.

(56) References Cited

U.S. PATENT DOCUMENTS

| | | | | |
|---|---|---|---|---|
| 4,786,581 | A * | 11/1988 | Stahlhofen et al. | 430/331 |
| 5,262,244 | A * | 11/1993 | Faust et al. | 428/463 |
| 6,399,276 | B1 | 6/2002 | VanDamme et al. | |
| 2003/0211418 | A1 * | 11/2003 | Kawauchi | 430/270.1 |
| 2003/0232288 | A1 * | 12/2003 | Oka et al. | 430/350 |

FOREIGN PATENT DOCUMENTS

| | | |
|---|---|---|
| EP | 0 734 151 | 9/1996 |
| EP | 1 025 992 | 8/2000 |

* cited by examiner

*Primary Examiner*—Cynthia H Kelly
*Assistant Examiner*—Chanceity N Robinson
(74) *Attorney, Agent, or Firm*—J. Lanny Tucker

(57) ABSTRACT

Process for the posttreatment of an imaged lithographic printing plate comprising (a) providing a lithographic printing plate comprising image areas and non-image areas on a lithographic substrate; (b) bringing the lithographic printing plate of step (a) into contact with a solution comprising a hydrophilic polymer comprising structural units derived from the following compounds: (i) a compound comprising both polyalkylene oxide chains and at least one structural unit which is free-radical polymerizable, and (ii) a monomer capable of copolymerizing with the free-radical polymerizable structural unit of (i) and furthermore comprising at least one acidic functional group with $pK_s<5$, wherein the acidic functional group can be present as a free acid group or in the form of a salt; (c) drying.

13 Claims, 3 Drawing Sheets

METHOD FOR MAKING A LITHOGRAPHIC PLATE

Figure 1:
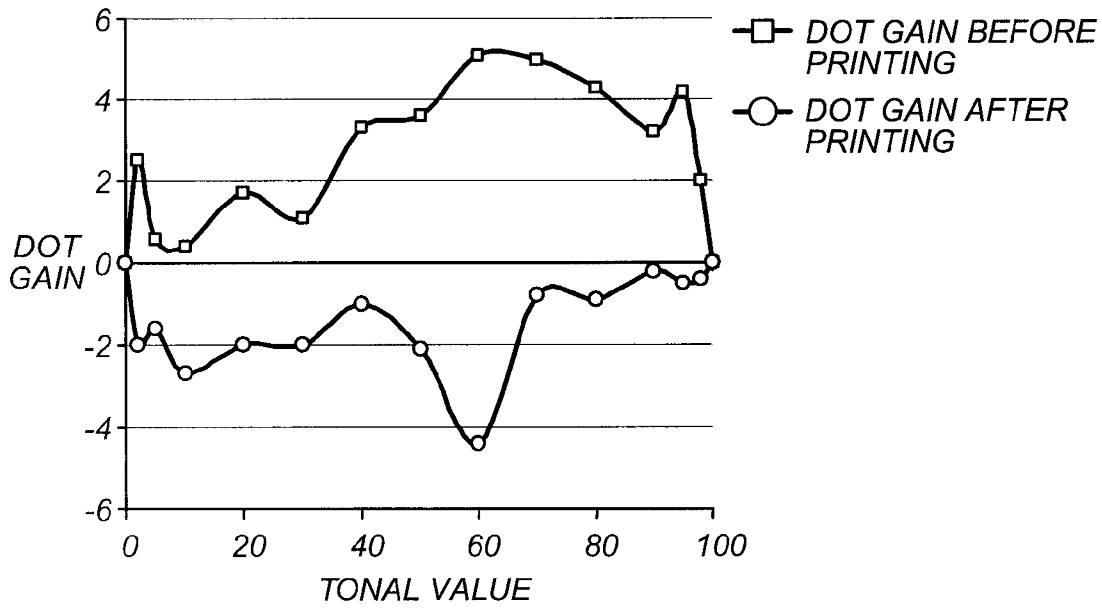

The present invention relates to a process for the production of lithographic printing plates, in particular to a process for treating a developed lithographic printing plate with a hydrophilic organic polymer. The invention furthermore relates to lithographic printing plates produced according to this process.

The technical field of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as "blanket", which then in turn transfers the printing ink onto the surface of the material on which the image is to be formed; this technique is referred to as offset lithography.

Usually, a lithographic printing plate precursor (in this context the term "printing plate precursor" refers to a coated printing plate prior to exposure and developing) comprises a radiation-sensitive coating applied onto a substrate, usually on aluminum basis. If a coating reacts to radiation such that the exposed portion becomes so soluble that it is removed during the developing process, the plate is referred to as "positive working". On the other hand, a plate is referred to as "negative working" if the exposed portion of the coating is hardened by the radiation so that it remains on the substrate during developing. In both cases, the remaining image area accepts printing ink, i.e. is oleophilic, and the non-image area (background) accepts water, i.e. is hydrophilic. The differentiation between image and non-image areas takes place during exposure. Usually, an aqueous alkaline developer whose pH value is usually in the range of 9 to 13.5 is used to remove the more soluble portions of the coating.

Usually, a substrate, in particular an aluminum substrate with aluminum oxide layer, is provided with a hydrophilic protective layer (also referred to as "interlayer") before the radiation-sensitive layer is applied. The interlayer can be applied to one or both sides of the substrate; depending on the amount that is applied, the surface of the side(s) of the substrate can be fully or only partially covered. The hydrophilic layer can for example improve the water acceptance of the (non-printing) background areas of a lithographic printing plate caused by the aluminum oxide layer, or the repulsion of the printing ink in these areas, so that the background areas obtained during printing are as clean as possible. The interlayer is furthermore intended to protect a metallic substrate against corrosion caused by strongly alkaline developers and against permanent adsorption of for example dyes used in the radiation-sensitive layer (what is referred to as "staining").

In the case of aluminum substrates, the interlayer can also protect the oxide layer against an attack by strongly alkaline developers (pH value>11.5), which otherwise would lead to a sludging of the developer bath. Another purpose of the interlayer is to provide a good compromise between good adhesion of the radiation-sensitive layer (which is important for a high print run length) on the one hand and residue-free removal of the radiation-sensitive layer in the background areas during developing on the other hand.

Document DE 25 327 69 A1 describes lithographic printing plate precursors on the basis of negative diazo resins having a sodium silicate interlayer. While the adhesion of the image areas to this interlayer is good, it has been found that the photosensitivity of these plates is greatly affected by storage at elevated temperatures and humidity. The use of polyvinylphosphonic acid or salts thereof as well as copolymers of vinylphosphonic acid with acrylic monomers as interlayers in lithographic printing plate precursors is suggested in U.S. Pat. No. 4,153,461.

For a clean printed image it is necessary that the image areas (i.e. the image-wise remaining coating) accept the printing ink well while the non-image areas (i.e. the image-wise exposed substrate, such as e.g. an aluminum substrate) are not supposed to accept the printing ink. In order to protect the image-wise exposed substrate, such as e.g. an aluminum substrate, against finger prints, the formation of aluminum oxide and corrosion, as well as against mechanical damage such as scratches when the printing plate is mounted onto the printing machine, i.e. in order to maintain and possibly improve the hydrophilicity of the non-image areas, the developed printing plate is usually subjected to a "gumming" treatment (also referred to as "finishing"). Gumming a plate before storage or prior to long periods of downtime on the printing machine ensures that the non-image areas remain hydrophilic. During printing, the gumming then has to be able to be removed quickly by the fountain solution used so that the image areas are able to accept ink immediately. Gumming solutions have been known for a long time and are often based on gum arabic (e.g. DE 29 26 645 A1).

U.S. Pat. No. 4,880,555 describes a "finisher" for lithographic printing plates comprising maltodextrin prepared by enzymatic hydrolysis, a polyol, hydrocarbons, a mixture of long-chain alcohol and aminated alcohol sulfate, substituted phenoxypoly(oxyethylene)ethanol and an ethanolamine.

U.S. Pat. No. 4,033,919 describes an aqueous gumming solution comprising a polymer which comprises units derived from acrylamide and 1 to 25 wt.-% of units with carboxy groups. The solution furthermore comprises an acidic material such as phosphonic acid, citric acid and tartaric acid. The documents U.S. Pat. No. 4,143,021 and DE 25 045 94 A1 also describe an aqueous gumming solution comprising a polymer or copolymer on the basis of polyacrylamide.

Document EP 0 985 546 A1 suggests the use of a compound of the following formula

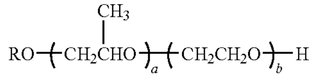

(wherein a and b independently represent an integer from 1 to 50 and R is an alkyl group with 8 to 22 carbon atoms) in a gumming solution for lithographic printing plates or in the fountain solution.

EP 1 260 866 A2 explains that it is possible to rinse the developer used for developing from a lithographic printing plate and to carry out a gumming process at the same time. For this purpose, the printing plate is brought into contact with rinsing water comprising (a) at least one film-forming water-soluble polymer and (b) at least one phosphonic acid derivative

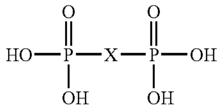

EP 0 943 967 A2 and DE 29 25 363 A1 describe emulsion-type gumming solutions.

It is the object of the present invention to provide a process for the production of a lithographic printing plate and for the posttreatment of a (developed) lithographic printing plate thereby increasing the adhesion of the image areas to the substrate, resulting in a higher sensitivity and a lower dot gain during printing, without interfering with the delicate equilibrium between printing ink and water and without causing problems such as toning upon re-starting the printing machine.

This object is achieved by a process wherein after image-wise exposure and developing a solution is applied which comprises a hydrophilic polymer comprising structural units derived from the following compounds:

(i) a compound comprising both polyalkylene oxide chains and at least one structural unit which is free-radical polymerizable, and (ii) a monomer capable of copolymerizing with the free-radical polymerizable structural unit of (i) and furthermore comprising at least one acidic functional group with $pK_s<5$, wherein the acidic functional group can be present as a free acid group or in the form of a salt.

The object is also achieved by an alternative process wherein the oleophilic image areas are image-wise applied onto a lithographic substrate and subsequently the above-described solution is applied.

As used in the present invention, the term "printing plate precursor" refers to an unimaged plate (i.e. a plate that has not been image-wise exposed and developed), from which a printing plate is produced by image-wise exposure and optionally developing. As used in the present invention, the term "printing plate" refers to an imaged plate (also referred to as "printing form") produced from a printing plate precursor.

Figure 2:
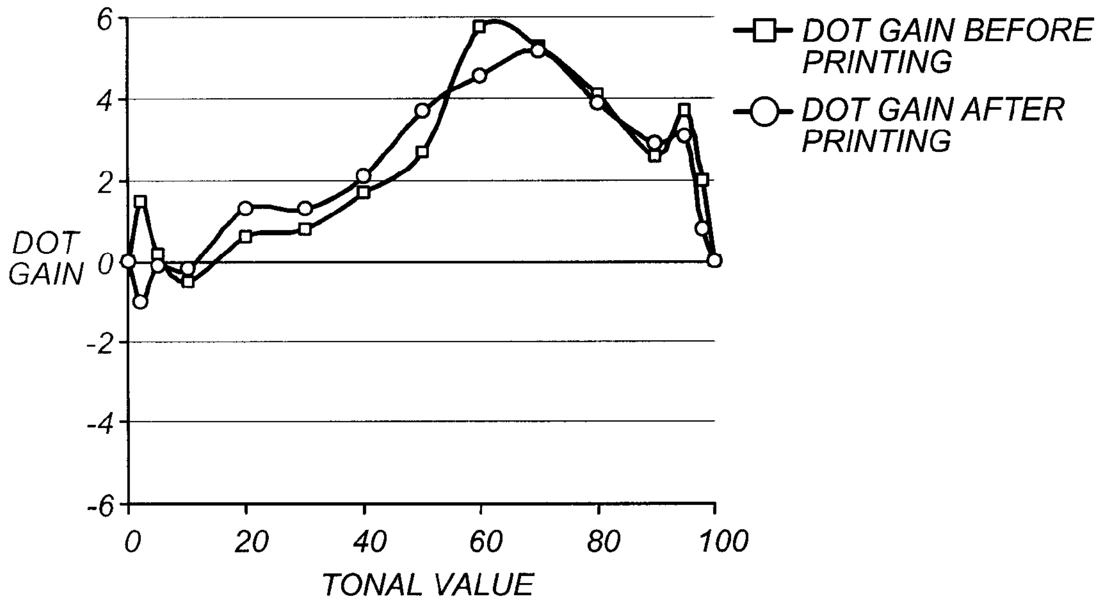
Figure 3:
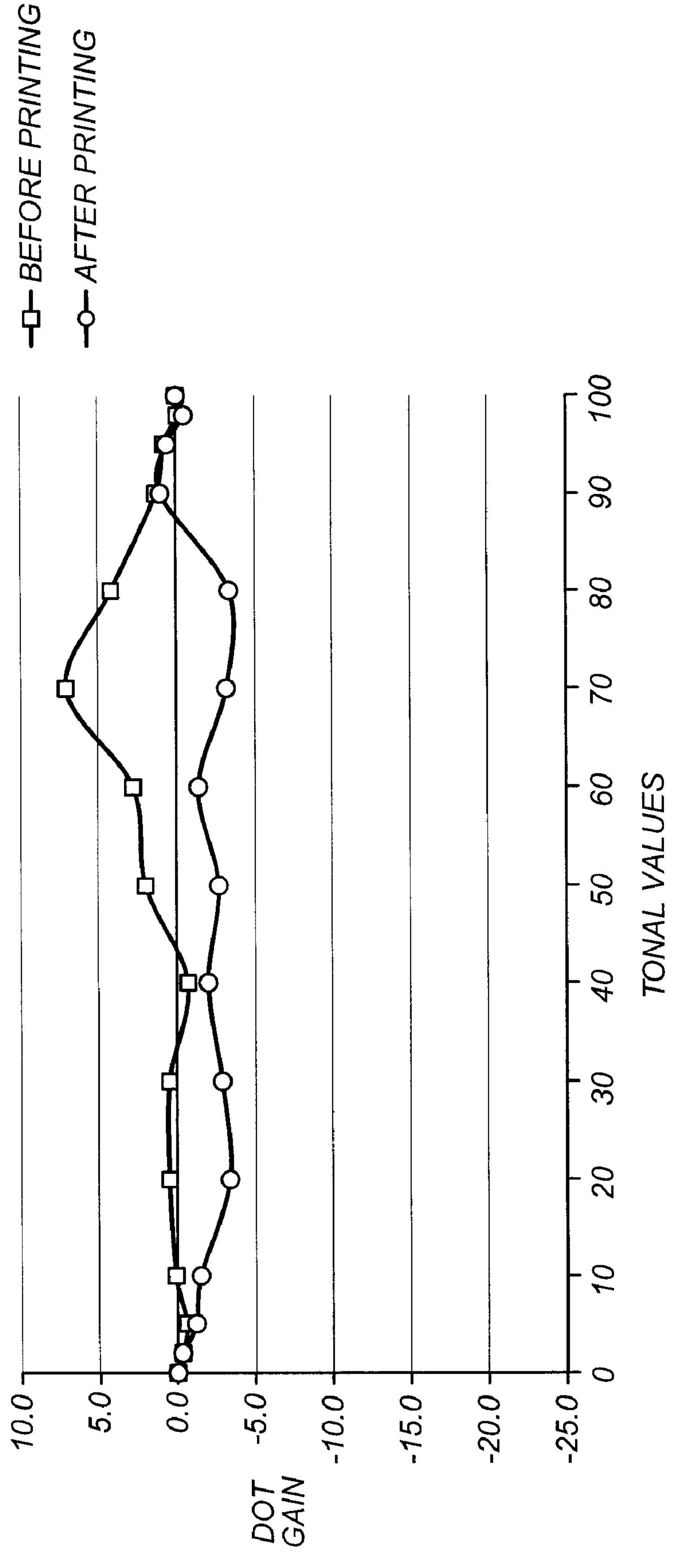
Figure 4:
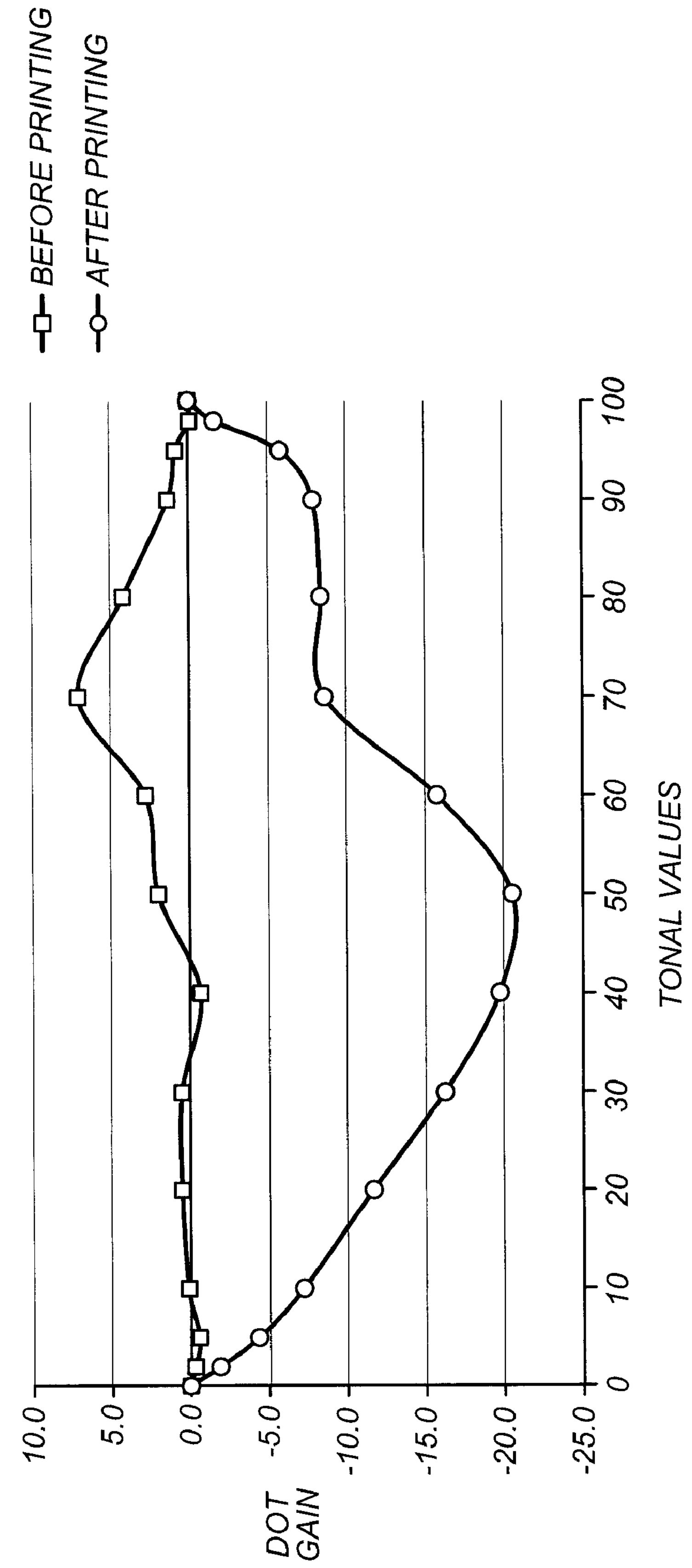

FIGS. 1 and 2 graphically illustrate the dot gain of a calibrated plate as a function of the tonal value as determined in Comparative Example 1 (FIG. 1; interlayer: PVPA, finishing with gumming solution 850 S®) and Example 18 (FIG. 2; without interlayer; posttreatment with polymer S4d; gumming). FIGS. 3 and 4 illustrate the dot gain as a function of the tonal value as determined in Example 45 (FIG. 3) and Comparative Example 4 (FIG. 4).

The hydrophilic polymer used for the posttreatment of a lithographic printing plate according to the present invention comprises structural units derived from the following compounds:

(i) a compound comprising both polyalkylene oxide chains and at least one structural unit which is free-radical polymerizable, and (ii) a monomer capable of copolymerizing with the free-radical polymerizable structural unit of (i) and furthermore comprising at least one acidic functional group with $pK_s<5$, wherein the acidic functional group can be present as a free acid group or in the form of a salt.

Optionally, the polymer can also comprise structural units derived from a comonomer (iii) different from monomer (ii), which preferably has hydrophilic properties and comprises at least one free-radical polymerizable group. By means of comonomer (iii), physical properties, such as e.g. solubility in $H_2O$, can be adjusted.

The compound (i) preferably comprises polyethylene oxide and/or polypropylene oxide chains; within the framework of the present invention, the prefix "poly" also encompasses oligomers.

The free-radical polymerizable structural unit of compound (i) is preferably derived from acrylic acid and/or methacrylic acid. The term "(meth)acrylic acid" encompasses both acrylic acid and methacrylic acid; analogously, the same applies to "(meth)acrylate".

Suitable examples of compound (i) include:

Poly(ethylene glycol) methacrylate, poly(ethylene glycol) acrylate, poly(propylene glycol) methacrylate, poly(propylene glycol) acrylate, monoesters of acrylic acid or methacrylic acid with block copolymers of ethylene oxide and propylene oxide, the reaction product of 2,4-toluene diisocyanate-terminated polyethylene glycol, polypropylene glycol, block copolymer of polyethylene glycol and polypropylene glycol or statistical poly(ethylene glycol-propylene glycol) copolymer with hydroxyalkyl acrylate or methacrylate (for example hydroxyethyl acrylate or methacrylate) or allyl alcohol, the monoreaction product of isocyanatoalkyl acrylate or methacrylate (in particular isocyanatoethyl acrylate or methacrylate) with polyethylene glycol, polypropylene glycol, block copolymer of polyethylene glycol and polypropylene glycol or statistical poly(ethylene glycol-propylene glycol) copolymer, ester or ether derivatives of poly(alkylene glycol) acrylate and methacrylate (in particular of poly(ethylene glycol) acrylate and methacrylate).

Especially preferred examples of compound (i) include

Poly(ethylene glycol) acrylate, poly(ethylene glycol) methacrylate, alkyl ethers of poly(ethylene glycol) acrylate, alkyl ethers of poly(ethylene glycol) methacrylate, poly(propylene glycol) acrylate and poly(propylene glycol) methacrylate, and poly(ethylene glycol) (meth)acrylate phosphoric acid monoesters.

In addition to a free-radical polymerizable group, monomer (ii) comprises at least one acidic functional group with $pK_s<5$. The at least one acidic functional group is preferably selected from a carboxylic acid group, a sulfonic acid group, a phosphonic acid group, a phosphoric acid group and mixtures thereof. The acidic functional group can be present as a free acid group or in the form of a salt.

Suitable examples of monomer (ii) include acrylic acid, methacrylic acid, crotonic acid, maleic acid anhydride ring-opened with a $C_1$-$C_6$ alkanol, vinylbenzoic acid, vinylphosphonic acid, vinylsulfonic acid, vinylbenzolsulfonic acid, monoesters of phosphoric acid with hydroxyalkyl(meth)acrylate (in particular hydroxyethyl methacrylate and hydroxyethyl acrylate) or allyl alcohol and sulfopropyl (meth)acryloylethyldialkylammoniumhydroxide.

Especially preferred monomers (ii) are (meth)acrylic acid, vinylphosphonic acid, the monoester of phosphoric acid with hydroxyethyl(meth)acrylate and (meth)acryloyl dimethyl-(3-sulfopropyl)-ammoniumhydroxide.

The optional free-radical polymerizable comonomer (iii) preferably results in a hydrophilic homopolymer upon homopolymerization. Suitable examples of comonomer (iii) include (meth)acrylamide, N-vinylpyrrolidone, hydroxyalkyl(meth)acrylate (in particular hydroxyethyl acrylate and hydroxyethyl methacrylate), allyl alcohol and N-vinylimidazole.

The molar ratio of compounds (i), (ii) and optionally (iii) is not particularly restricted. Preferably, the structural units derived from (i) account for 5 to 95 wt.-% of the hydrophilic polymer, based on all the structural units, especially preferred 20 to 80 wt.-%.

Preferably, the structural units derived from (ii) account for 5 to 95 wt.-% of the hydrophilic polymer, based on all the structural units, especially preferred 20 to 80 wt.-%.

Preferably, the optional structural units derived from (iii) account for 0 to 50 wt.-% of the hydrophilic polymer, based on all the structural units, especially preferred 0 to 30 wt.-%.

The copolymerization of compound (i), monomer (ii) and optionally comonomer (iii) is preferably carried out in solution. Organic solvents or solvent mixtures, water, or mixtures of water and an organic solvent miscible with water can be used for this purpose. Preferably, both the starting components (i), (ii) and optionally (iii) and the product are soluble therein.

According to a preferred embodiment, a solvent with negligible vapor pressure (i.e. the vapor pressure cannot be measured by means of commercially available osmometers) is used (such a solvent is also referred to as a "green solvent"), such as an ionic liquid; for more information on "green solvents" see "Ionic Liquids as Green Solvents Progress and Prospects" by Robin D. Rogers and Kenneth R. Seddon, in ACS Symposium Series No. 856 and "Ionic Liquids in Synthesis" by Peter Wasserscheid and Thomas Welton, Wiley—VCH 2003.

It has been found that polymers that have been prepared by polymerization in a solvent with negligible vapor pressure, such as e.g. an ionic liquid, differ in their properties from polymers prepared by solvent polymerization of the same monomers in a solvent with measurable vapor pressure. According to one embodiment, a polymer with the structural units as defined above prepared by polymerization in an ionic liquid is used as hydrophilic polymer. For the use of the polymer in lithographic printing plates according to the present invention, it is not necessary that the ionic liquid is completely removed from the polymer. It is also possible to prepare the hydrophilic polymers without an ionic liquid and then mixing the resulting polymers with an ionic liquid.

The following ionic liquids can for example be used for polymerizations:

Imidazolium salts of the general formula (A)

(A)

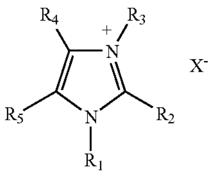

wherein $X^-$ is for example selected from $BF_4^-$, $PF_6^-$, dimethylphosphate, tosylate, methylsulfate and

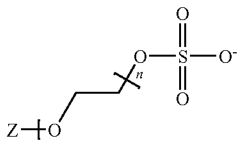

($n \geqq 1$, Z=H or alkyl), $R_1$ and $R_3$ are for example selected from alkyl substituents and

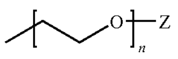

($n \geqq$, Z=H or alkyl), and $R_2$, $R_4$ and $R_5$ are independently selected for example from alkyl substituents,

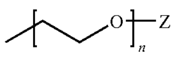

($n \geqq 1$, Z=H or alkyl) and H, pyridinium salts of the general formula (B)

(B)

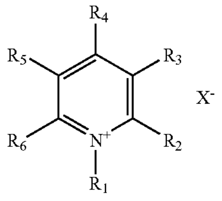

wherein $X^-$ is for example selected from $BF_4^-$, $PF_6^-$, dimethylphosphate, tosylate, alkylsulfate and

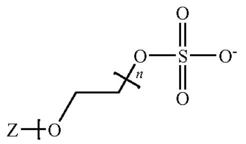

($n \geqq 1$, Z=H or alkyl), $R_1$ is for example selected from an alkyl substituent and

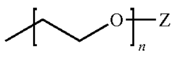

($n \geqq 1$, Z=H or alkyl) and $R_2$, $R_3$, $R_4$, $R_5$ and $R_6$ are independently selected for example from alkyl substituents,

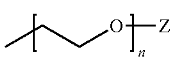

($n \geqq 1$, Z=H or alkyl) and H, phosphonium salts of the general formula (C)

(C)

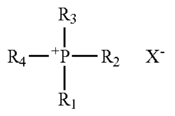

wherein $X^-$ is for example selected from $BF_4^-$, $PF_6^-$, dimethylphosphate, tosylate, methylsulfate and

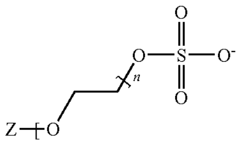

($n \geqq 1$, Z=H or alkyl), $R_1$, $R_2$, $R_3$ and $R_4$ are independently selected for example from alkyl substituents and

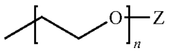

($n \geqq 1$, Z=H or alkyl) and ammonium salts of the general formula (D)

(D)

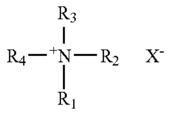

wherein $X^-$ is for example selected from $BF_4^-$, $PF_6^-$, dimethylphosphate, tosylate, methylsulfate and

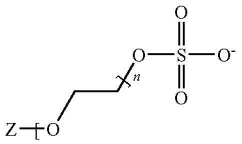

($n \geqq 1$, Z=H or alkyl)

and $R_1$, $R_2$, $R_3$ and $R_4$ are independently selected for example from alkyl substituents and

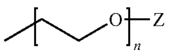

($n \geqq 1$, Z=H or alkyl).

The lithographic substrate is a dimensionally stable plate or foil-shaped material.

Preferably, a material is used as dimensionally stable plate or foil-shaped material that has already been used as a substrate for printing matters. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability and is inexpensive. Furthermore, a composite film can be used wherein an aluminum foil has been laminated onto a plastic film, such as e.g. a polyethylene terephthalate film, or paper, or a plastic film onto which aluminum has been deposited by means of vapor deposition.

A metal substrate, in particular an aluminum substrate, is preferably subjected to at least one treatment selected from graining (e.g. by brushing in a dry state or brushing with abrasive suspensions, or electrochemical graining, e.g. by means of hydrochloric acid or $HNO_3$) and anodizing (e.g. in sulfuric acid or phosphoric acid).

The lithographic substrate can also comprise a common interlayer; however, this is not necessary in the present invention.

The details of the above-mentioned substrate pre-treatment are known to the person skilled in the art.

An aluminum foil which preferably has a thickness of 0.1 to 0.7 mm, more preferred 0.15 to 0.5 mm, is an especially preferred substrate. It is preferred that the foil be grained (preferably electrochemically) and then show an average roughness of 0.2 to 1 μm, especially preferred 0.3 to 0.8 μm.

According to an especially preferred embodiment, the grained aluminum foil was furthermore anodized. The layer weight of the resulting aluminum oxide is preferably 1.5 to 5 $g/m^2$, especially preferred 2 to 4 $g/m^2$.

The posttreatment of lithographic printing plates according to the present invention is suitable for all types of lithographic printing plates, i.e. both those produced from positive working precursors and those produced from negative working precursors, wherein the printing plate precursors can either be UV/VIS-sensitive or heat-sensitive (such as IR-sensitive). The precursors can either be single-layer precursors or precursors having a multi-layer structure.

The radiation-sensitive coating can for example be a negative working UV-sensitive coating on the basis of negative diazo resins as described, inter alia, in EP 0 752 430 B1, a negative working photopolymer layer sensitive to radiation of about 405 nm (see e.g. DE 103 07 451.1), a negative working photopolymer system sensitive to radiation from the visible range of the spectrum (e.g. EP 0 684 522 B1) or a negative working IR-sensitive layer based on free-radical polymerization (e.g. DE 199 06 823 C2).

Furthermore, the radiation-sensitive coating can be a positive working UV-sensitive layer based on quinone diazides and novolaks, as described in U.S. Pat. No. 4,594,306, or a positive working IR-sensitive layer on the basis of a mixture of novolaks and IR dyes (see also EP 0 887 182 B1 and EP 1 101 607 A1).

Furthermore, the printing plate precursor used in the production of the printing plates can be a negative working single-layer IR-sensitive element wherein the radiation-sensitive layer is rendered insoluble in or impenetrable by aqueous alkaline developer upon IR irradiation and preferably comprises (i) at least one compound which forms an acid upon application of heat (in the following also referred to as "latent Bronsted acid"), and (ii) a component cross-linkable by an acid (in the following also referred to as "cross-linking agent") or a mixture thereof and optionally (iii) a binder resin or a mixture thereof.

Such systems are for example described in EP 0 625 728 B1 and EP 0 938 413 B1.

Positive working dual-layer elements comprising, on the hydrophilic surface of the substrate, a first layer soluble in aqueous alkaline developer whose solubility is not changed by IR irradiation, and on top of that layer a top layer insoluble in aqueous alkaline developer which is rendered soluble in or penetrable by the developer upon IR irradiation can also be used as printing plate precursors.

Known principles can be applied for the top layer:

(a) A polymer insoluble in strongly alkaline aqueous developer (pH>11) is used which is rendered soluble in or penetrably by the developer by IR irradiation; such systems are for example described in U.S. Pat. No. 6,352,812.

(b) A polymer soluble in strongly alkaline aqueous developer (pH>11) is used whose solubility is reduced to such a high degree by a simultaneously present solubility inhibitor that the layer is not soluble or penetrable under developing conditions; the interaction between the polymer and the inhibitor is weakened by IR radiation to such a degree that the irradiated (heated) areas of the layer are rendered soluble in or penetrable by the developer. Such systems are for example described in U.S. Pat. No. 6,352,811 and U.S. Pat. No. 6,358,669. It is not necessary that the polymer and the solubility inhibitor be two separate compounds, but polymers can be used which at the same time have a solubility inhibiting effect, such as e.g. the functionalized resins described in US 2002/0,150,833 A1, U.S. Pat. No. 6,320,018 B and U.S. Pat. No. 6,537,735 B, such as e.g. functionalized novolaks.

(c) A polymer insoluble in aqueous alkaline developer with pH<11 (but soluble at pH>11) is used, which upon IR irradiation becomes soluble in such a developer with pH<11, and the irradiated element is developed with an alkaline developer with pH<11. Such a system is for example described in WO 02/14071.

According to one embodiment of the present invention, a lithographic printing plate is produced according to a process comprising (a) providing a lithographic substrate,
(b) applying at least one radiation-sensitive composition onto the substrate and drying,
(c) image-wise irradiating the lithographic printing plate precursor obtained in step (b),
(d) removing the non-image areas from the image-wise irradiated precursor by means of a developer solution,
(e) treating the developed printing plate with a solution of a hydrophilic polymer as described above.

Optionally, the image-wise irradiated lithographic printing plate precursor obtained in step (c) can be heated prior to the treatment with the developer.

The radiation-sensitive composition can be applied to the surface of the substrate by means of common methods such as e.g. spin coating, dip coating, spray coating and coating by means of doctor blades). It is possible to apply the radiation-sensitive composition on both sides of the substrate; however, an application on only one side of the substrate is preferred.

The substrate preferably does not comprise an interlayer; a grained and anodized aluminum foil without interlayer is especially preferred.

Depending on the sensitizer used in the composition, the printing plate precursor is image-wise exposed with UV/VIS radiation (about 320 to 750 nm) or IR radiation (more than 750 to 1,600 nm, preferably more than 750 to 1,350 nm). For irradiation with UV/VIS radiation, common lamps, such as carbon arc lamps, mercury lamps, xenon lamps and metal halide lamps, or lasers or laser diodes can be used. UV laser diodes emitting UV radiation in the range of about 405 nm (e.g. 405±10 nm) and frequency-doubled Nd:YAG lasers emitting at around 532 nm are of particular interest as a radiation source. Suitable sources of IR radiation include e.g. semi-conductor lasers or laser diodes which preferably emit in the wavelength range of 750 to 1,350 nm.

Depending on whether the layer is a positive working radiation-sensitive layer or a negative working radiation-sensitive layer, the exposed or non-exposed areas are subsequently removed with the developer which results in printing image areas and non-printing background areas. Alkaline aqueous developers are preferably used as developers; those with a pH value in the range of 9 to 13.5 are especially preferred.

According to an alternative embodiment, it is also possible to apply the printing oleophilic areas image-wise to the substrate (e.g. by means of inkjet processes, thermotransfer processes and toner transfer processes) so that image-wise irradiation and developer are no longer necessary.

For the posttreatment of the imaged lithographic printing plate according to the present invention a solution of the hydrophilic polymer is prepared, preferably with a concentration of 0.01 to 10 wt.-%, based on the solvent, more preferred 0.05 to 5 wt.-%, and especially preferred 0.1 to 1 wt.-%. This solution is then applied using common coating processes such as e.g. dip coating, roller coating, spray coating, coating with a doctor blade and coating with a slot coater. The solvent used in this process has a temperature of preferably 20 to 90° C. The posttreatment according to the present invention can also be carried out in a plate developing machine.

In addition to the hydrophilic polymer and the gumming agent, the solution can furthermore contain common additives such as thickening agents, surfactants, bactericides, fungicides etc.

The printing plate treated with the solution is then dried, for example in the air or by means of a hot-air dryer or an infrared dryer. Drying is preferably carried out at a temperature of 20 to 120° C., especially preferred 20 to 80° C.

If desired, a common gumming process can be carried out after the posttreatment with the hydrophilic polymer, e.g. the application of an aqueous solution containing gum arabic by means of common methods (e.g. roller coating).

However, according to an alternative embodiment, the solution of the hydrophilic polymer used for the posttreatment can additionally contain gum arabic or another gumming agent so that posttreatment and gumming are carried out in one step.

The present invention is described in more detailed in the following examples; however, they are not intended to restrict the invention in any way.

PREPARATION EXAMPLES

1. Synthesis Process S1

Preparation of Copolymers S1-a to S1-d

In a mixture of n-propanol and water (4:1 parts by volume) $x_1$ g a1 and $x_2$ g a2 were dissolved, resulting in a 15 wt.-% solution. The resulting solution was purged with nitrogen and heated to 70° C. At 70° C., $x_3$ mole-% azobisisobutyronitrile AIBN (based on the monomer) were added, while purging with nitrogen was continued and the reaction temperature maintained. After 2 hours, the same amount of AIBN was again added to the polymerization mixture.

The reaction mixture was stirred for another 10 hours at the same reaction temperature, while purging with nitrogen was continued. Then the mixture was left to cool to room temperature and the excess solvent was evaporated off. The resulting oily product was added to a 10-fold excess of petroleum ether, causing a highly viscous product to precipitate. The petroleum ether was evaporated off under reduced pressure until a constant mass of final product was obtained. The final product was then dried in a vacuum for 24 hours at 50° C. The resulting copolymer was examined by means of differential thermal analysis (DTA), differential calorimeter (DSC), IR-spectroscopy, elementary analysis and gel-permeation chromatography (GPC) and the acid value was determined by titration. Table 1 summarizes the educts used for the preparation of copolymers S1-a to S1-d as well as their amounts.

TABLE 1

| Copolymer | a1 | $x_1$ (g) | a2 | $x_2$ (g) | $x_3$ (mole-%) |
|---|---|---|---|---|---|
| S1-a | AA[1)] | 35 | PEGMA[3)] | 15 | 0.2 |
| S1-b | AA | 15 | PEGMA | 35 | 0.2 |
| S1-c | MAA[2)] | 35 | PEGMA | 15 | 0.2 |
| S1-d | MAA | 15 | PEGMA | 35 | 0.2 |

1)Acrylic acid
2)Methacrylic acid
3)Poly(ethylene glycol) methacrylate with $M_n$ = 526 g/mole 2. Synthesis Process S2

Preparation of Copolymers S2-a and S2-b $x_1$ g a1 and $x_2$ g a2 were dissolved in methyl ethyl ketone, resulting in a 15 wt.-% solution. The resulting solution was purged with nitrogen and heated to 70° C.

At 70° C., $x_3$ mole-% AIBN (based on the monomer) were added, while purging with nitrogen was continued and the reaction temperature maintained. The polymer started to precipitate. After 2 hours, the same amount of AIBN was again added to the polymerization mixture and after 2 more hours, the same amount of AIBN was added once more. The mixture was stirred for another 10 hours at the same reaction temperature, while purging with nitrogen was continued. The precipitated copolymer was isolated, washed with petroleum ether and then dried in a vacuum for 24 hours at 50° C. The resulting copolymer was examined by means of DTA, DSC, IR-spectroscopy, elementary analysis and GPC, and the acid value was determined by titration. Table 2 summarizes the educts used for the preparation of copolymers S2-a and S2-b as well as their amounts.

TABLE 2

| Copolymer | a1 | $x_1$ (g) | a2 | $x_2$ (g) | $x_3$ (mole-%) |
|---|---|---|---|---|---|
| S2-a | VPA[4)] | 35 | PEGMA | 15 | 0.13 |
| S2-b | VPA | 15 | PEGMA | 35 | 0.13 |

4)Vinylphosphonic acid

3. Synthesis Process S3

Preparation of Copolymers S3-a to S3-h $x_4$ wt.-% solvent A were provided in a reaction flask, purged with nitrogen and heated to 70° C. Purging with nitrogen was continued throughout the entire reaction time.

$x_1$ g a1, $x_2$ g a2 and $x_3$ mole-% AIBN (based on the monomer) were dissolved in solvent B resulting in a 50 wt.-% solution. The solution was transferred to a dropping funnel and slowly added drop-wise to solvent A in the reaction flask. After the entire solution had been added, the reaction mixture was stirred for 10 hours while the reaction mixture was allowed to slowly cool to room temperature. Excess solvent was removed in a vacuum. The product was purified by repeated dissolving in suitable solvents and precipitation. Then the product was dried in a vacuum for 24 hours at 50° C. The resulting copolymer was examined by means of DTA, DSC, IR-spectroscopy, elementary analysis, NMR-spectroscopy and GPC, and the acid value was determined by titration.

Table 3 summarizes the educts used for the preparation of copolymers S3-a to S3-h as well as their amounts and the solvents used.

TABLE 3

| Copolymer | a1 | $x_1$ (g) | a2 | $x_2$ (g) | $x_3$ (mole-%) | $x_4$ (wt.-%) | A | B |
|---|---|---|---|---|---|---|---|---|
| S3-a | AA | 35 | PEGMA | 15 | 0.6 | 85 | PROH-W[8)] | MEK[9)] |
| S3-b | AA | 15 | PEGMA | 35 | 0.6 | 85 | PROH-W | MEK |
| S3-c | MAA | 35 | PEGMA | 15 | 0.6 | 85 | PROH-W | MEK |
| S3-d | MAA | 15 | PEGMA | 35 | 0.6 | 85 | PROH-W | MEK |
| S3-e | MEP[5)] | 35 | PEGMA | 15 | 0.6 | 85 | PROH-W | PROH-W |
| S3-f | MPEP[6)] | 15 | PEGMA | 35 | 0.6 | 85 | PROH-W | PROH-W |
| S3-g | MEDMSPA[7)] | 35 | PEGMA | 15 | 0.6 | 85 | PROH-W | PROH-W |
| S3-h | MEDMSPA | 15 | PEGMA | 35 | 0.6 | 85 | PROH-W | PROH-W |

5)Methacryloylethyl phosphate
6)Methacryloylpolyethylene glycol phosphate
7)Methacryloylethyl dimethylsulfopropyl-ammoniumhydroxide
8)Mixture of n-propanol and water (4:1 parts by volume)
9)Methyl ethyl ketone 4. Synthesis Process S4

Preparation of Copolymers S4-a to S4-d $x_5$ wt.-% solvent A were provided in a reaction flask, purged with nitrogen and heated to 70° C. Purging with nitrogen was continued throughout the entire reaction time.

$x_1$ g a1, $x_2$ g a2 and $x_3$ mole-% AIBN (based on the monomer) were dissolved in solvent B resulting in a 50 wt.-% solution. The solution was transferred to a dropping funnel and slowly added drop-wise to solvent A in the reaction flask. After the entire solution had been added, the reaction mixture was stirred for 10 hours while the reaction mixture was allowed to slowly cool to room temperature. Excess solvent was removed in a vacuum. The product was purified by repeated dissolving in suitable solvents and precipitation.

Finally, the product was dried in a vacuum for 24 hours at 50° C. The resulting copolymer was examined by means of IR-spectroscopy, elementary analysis, NMR-spectroscopy and GPC, and the acid value was determined by titration.

Table 4 summarizes the educts used for the preparation of copolymers S4-a to S4-d as well as their amounts and the solvents used.

TABLE 4

| Co-polymer | a1 | $x_1$ (g) | a2 | $x_2$ (g) | a3 | $x_3$ (g) | $x_4$ (mole-%) | $x_5$ (wt.-%) | A | B |
|---|---|---|---|---|---|---|---|---|---|---|
| S4-a | VPA | 35 | PEGMA | 15 | — | — | 0.6 | 85 | PROH-W | MEK |
| S4-b | VPA | 15 | PEGMA | 35 | — | — | 0.6 | 85 | PROH-W | MEK |
| S4-c | MEDMSPA | 35 | PEGMA | 15 | — | — | 0.6 | 85 | PROH-W | MEK |
| S4-d | AA | 25 | PEGMA | 15 | AAM | 10 | 0.6 | 85 | PROH-W | MEK |

5. Synthesis Process S5

Preparation of Copolymers S5-a to S5-i $x_4$ wt.-% ionic liquid, consisting of an organic cation and anion, $x_1$ g a1 and $x_2$ g a2 were provided in a reaction flask, purged with nitrogen and heated to 70° C. Purging with nitrogen was continued throughout the entire reaction time. Then $x_3$ mole-% AIBN were added, which was repeated twice at intervals of 2 hours. Then stirring was continued for 10 hours. The precipitated copolymer was isolated, washed with acetonitrile if desired, and then dried in a vacuum for 24 hours at 50° C. The resulting copolymer was examined by means of IR-spectroscopy, elementary analysis, NMR-spectrometry and GPC, and the acid value was determined by titration.

Table 5 summarizes the educts used for the preparation of copolymers S5-a to S5-i as well as their amounts and the solvents used.

TABLE 5

| Co-polymer | a1 | $x_1$ (g) | a2 | $x_2$ (g) | $x_3$ (mole-%) | $x_4$ (wt.-%) | Cation | Anion | Ionic liquid in hydrophilic polymer (wt.-%) |
|---|---|---|---|---|---|---|---|---|---|
| S5-a | AA | 35 | PEGMA | 15 | 0.13 | 85 | MBIM[10)]+ | $BF_4^-$ | 28 |
| S5-b | AA | 35 | PEGMA | 15 | 0.13 | 85 | $MBIM^+$ | $PF_6^-$ | 15 |
| S5-c | AA | 35 | PEGMA | 15 | 0.13 | 85 | $MBIM^+$ | $(CH_3O)_2P(O)O^-$ | 58 |
| S5-d | MAA | 35 | PEGMA | 15 | 0.13 | 85 | $MBIM^+$ | $BF_4^-$ | 62 |
| S5-e | MAA | 35 | PEGMA | 15 | 0.13 | 85 | $MBIM^+$ | $PF_6^-$ | 67 |
| S5-f | MAA | 35 | PEGMA | 15 | 0.13 | 85 | $MBIM^+$ | $(CH_3O)_2P(O)O^-$ | 56 |
| S5-g | VPA | 35 | PEGMA | 15 | 0.13 | 85 | $MBIM^+$ | $BF_4^-$ | 51 |
| S5-h | VPA | 35 | PEGMA | 15 | 0.13 | 85 | $MBIM^+$ | $PF_6^-$ | 23 |
| S5-i | VPA | 35 | PEGMA | 15 | 0.13 | 85 | $MBIM^+$ | $(CH_3O)_2P(O)O^-$ | 15 |

[10)]Methyl-3-butylimidazolium

Preparation of Substrate 1

(Substrate without Interlayer)

An electrochemically grained (with HCl, average roughness 0.6 μm) and anodized aluminum foil (weight of the oxide layer 3.2 g/$m^2$) was prepared; no interlayer was applied.

Preparation of Substrate 2

(Substrate with Polyvinylphosphonic Acid Interlayer)

An electrochemically grained (with HCl, average roughness 0.6 μm) and anodized aluminum foil (weight of the oxide layer 3.2 g/$m^2$) was subjected to an after treatment with an aqueous solution of 1.5 g/l polyvinylphosphonic acid (PVPA) for 10 s at 50° C., resulting in an interlayer with 15 mg/$m^2$ PVPA on the aluminum substrate.

Examples 1 to 44 and Comparative Examples 1 to 3

Lithographic Printing Plate Precursors with UV-Sensitive Photopolymer Layer

A UV-sensitive, filtered coating solution as described in Table 6 was applied to the substrate listed in Table 7 and dried for 4 minutes at 90° C. The dry layer weight of the photopolymer layer was about 1.5 g/$m^2$.

The thus obtained samples were provided with an overcoat layer by coating them with an aqueous solution of poly(vinyl alcohol) (degree of hydrolysis 88%); after drying for 4 minutes at 90° C., the overcoat layer had a dry layer weight of about 3 g/$m^2$.

The printing plate precursor was exposed with an imagesetter (Andromeda® A750M from Lithotech), equipped with a laser diode emitting at 405 nm (P=30 mW, cw). A UGRA gray scale V2.4 with defined tonal values (all data was linearized in order to approximately obtain the desired tonal value) was exposed onto the plate precursor described above. Additionally, the sensitivity of the plate was determined using an UGRA Offset test scale 1982 with overall exposure. Immediately after exposure, the plate was heated in an oven for 2 minutes to 90° C.

Then the exposed and thermally treated plate was treated for 30 seconds with a developer solution having a pH value of about 12 and containing KOH as alkaline component and poly(oxyethylene)-2-naphthyl ether.

Then the developer solution was again rubbed over the surface for another 30 seconds using a tampon and then the entire plate was rinsed with water. After this treatment, the exposed portions remained on the plate.

TABLE 6

| | | |
|---|---|---|
| 1.02 | g | of a terpolymer prepared by polymerization of 470 parts by weight styrene, 336 parts by weight methyl methacrylate and 193 parts by weight methacrylic acid, 30% solution in propylene glycol monomethylether |
| 0.1 | g | Kayamer PM-2 ® (1 mole phosphoric acid esterified with 1.5 moles hydroxyethyl methacrylate) |
| 0.2 | | mercapto-3-triazole |
| 3.92 | g | of an 80% methyl ethyl ketone solution of a urethane acrylate prepared by reacting Desmodur N 100 ® with hydroxyethyl acrylate and pentaerythritol triacrylate; amount of double bonds: 0.5 double bonds per 100 g when all isocyanate groups have completely reacted with the acrylates containing hydroxy groups |
| 0.45 | g | ditrimethylolpropane tetraacrylate |
| 1.25 | g | of a dispersion in propylene glycol monomethylether comprising 7.25 wt.-% copper phthalocyanine and 7.25 wt.-% of a polyvinylacetal binder comprising 39.9 mole-% vinyl alcohol groups, 1.2 mole-% vinyl acetate groups, 15.4 mole-% acetal groups derived from acetaldehyde, 36.1 mole-% acetal groups derived from butyric aldehyde and 7.4 mole-% acetal groups derived from 3-formylbenzoic acid |
| 0.25 | g | 2-phenyl-4-(2-chlorophenyl)-5-(4-diethylaminophenyl)-oxazole |
| 0175 | g | 2,2-bis(2-chlorophenyl)-4,5,4',5'-tetraphenyl-2'H-[1,2']-biimidazolyl |
| 20 | ml | propylene glycol monomethylether |
| 16 | ml | methanol |
| 25 | ml | methyl ethyl keton |

Examples 1 to 27 were carried out as follows:

The developed plates were treated according to the present invention with a polymer solution; for this purpose, the entire plate, i.e. image areas and non-image areas, were carefully rubbed with a tampon moistened with the corresponding polymer solution and then dried at room temperature. Then an aqueous gumming solution (0.5% $H_3PO_4$, 6% gum arabic) was applied using standard processes. Details regarding the substrates, polymers, solvents for the polymer solutions and gumming used in the examples as well as the results obtained with respect to sensitivity, relative dot gain and toning can be inferred from Table 7. The polymer solutions contained 2 wt.-% of the various polymers.

Examples 28 to 44 were carried out as follows:

The developed plates were treated with a gumming solution which also contained the polymer solution, i.e. posttreatment and gumming were carried out in a single step.

Details can be inferred from Table 7 as well.

The relative dot gain and the sensitivity were determined as follows:

The plates were mounted in a sheet-fed offset printing machine and used for printing with an abrasive printing ink (Offset S7184 from Sun Chemical, containing 10% $CaCO_3$).

The term "dot gain" describes the change in the tonal values of a linearized plate during printing. Linearization means that a digital plate is exposed such that a predetermined set tonal value (STV) is approximately obtained. The accessible measured values are the tonal values (TV). They are exposed onto the linearized plate in different magnitudes (index i in formula 1) resulting in a differentiated image with respect to the tonal values after developing, depending on the selection of these magnitudes. Thus, a series of data of tonal values before printing (TVB) is obtained. The linearized, developed and, according to the present invention, after-treated printing plate is used in a printing machine for 10,000 prints, cleaned and then again subjected to a tonal value examination, which shows the tonal values after printing (TVA). Then the dot gain is calculated using equation (1).

$$\text{Dot gain} = \sum_i ((TVB[i] - STV[i]) + (TVA[i] - STV[i])) \quad (1)$$

The dot gain can have either a positive or a negative sign. It is merely the absolute value which is of interest for practical printing applications, which in an ideal case should converge towards zero.

In other words: The lower the dot gain, the better the plate.

The plate of Comparative Example 1, i.e. a plate with considerable dot gain during printing at different tonal values, is used as a reference. The relative dot gain is calculated using equation (2) below:

$$\text{relative dot gain} = \frac{\text{dot gain (sample)}}{\text{dot gain (reference)}} \cdot 100\% \quad (2)$$

FIGS. 1 and 2 graphically illustrate the dot gain results for Comparative Example 1 and Example 18.

FIGS. 1 and 2 show the dot gain at different tonal values before printing and after 10,000 runs on the printing machine (i.e. 10,000 copies).

The relative dot gain in FIG. 1 (Comparative Example 1) was assumed to be 100%; the relative dot gain in FIG. 2 (Example 18) was calculated to be 5%, which is negligible.

The printing plate precursors of Examples 1 to 44 were furthermore subjected to a storage stability test; for this purpose, the plate precursors were stored for 90 minutes at 88° C. It was found that they practically did not differ from fresh plates as regards sensitivity and printing behavior.

TABLE 7

| Example | Substrate | Post-treatment 1) | Solvent 2) | Finishing 3) | Sensitivity 4) | Relative dot gain (relative area) 5) and other printing behavior |
|---|---|---|---|---|---|---|
| Comp. 1 | Substrate 2 | none | — | Gumming solution | 4 | 100, no ink acceptance problem, no toning; low sensitivity |
| Comp. 2 | Substrate 1 | PVPA | Water | Gumming solution | 6 | poor ink acceptance in image areas, toning in background areas |
| Comp. 3 | Substrate 1 | none | — | Gumming solution | 6 | toning |

TABLE 7-continued

| Example | Substrate | Post-treatment[1)] | Solvent[2)] | Finishing[3)] | Sensitivity[4)] | Relative dot gain (relative area)[5)] and other printing behavior |
|---|---|---|---|---|---|---|
| 1 | Substrate 1 | S1a | PROH-W | Gumming solution | 6 | 5, no ink acceptance problem, no toning |
| 2 | Substrate 1 | S1b | PROH-W | Gumming solution | 6 | 4, no ink acceptance problem, no toning |
| 3 | Substrate 1 | S1c | PROH-W | Gumming solution | 6 | 6, no ink acceptance problem, no toning |
| 4 | Substrate 1 | S1d | PROH-W | Gumming solution | 6 | 5, no ink acceptance problem, no toning |
| 5 | Substrate 1 | S2a | Water | Gumming solution | 6 | 3, no ink acceptance problem, no toning |
| 6 | Substrate 1 | S2b | Water | Gumming solution | 6 | 4, no ink acceptance problem, no toning |
| 7 | Substrate 1 | S3a | PROH-W | Gumming solution | 6 | 6, no ink acceptance problem, no toning |
| 8 | Substrate 1 | S3b | PROH-W | Gumming solution | 6 | 5, no ink acceptance problem, no toning |
| 9 | Substrate 1 | S3c | PROH-W | Gumming solution | 6 | 4, no ink acceptance problem, no toning |
| 10 | Substrate 1 | S3d | PROH-W | Gumming solution | 6 | 7, no ink acceptance problem, no toning |
| 11 | Substrate 1 | S3e | Water | Gumming solution | 6 | 4, no ink acceptance problem, no toning |
| 12 | Substrate 1 | S3f | Water | Gumming solution | 6 | 3, no ink acceptance problem, no toning |
| 13 | Substrate 1 | S3g | PROH-W | Gumming solution | 6 | 6, no ink acceptance problem, no toning |
| 14 | Substrate 1 | S3h | PROH-W | Gumming solution | 6 | 4, no ink acceptance problem, no toning |
| 15 | Substrate 1 | S4a | Water | Gumming solution | 6 | 8, no ink acceptance problem, no toning |
| 16 | Substrate 1 | S4b | Water | Gumming solution | 6 | 6, no ink acceptance problem, no toning |
| 17 | Substrate 1 | S4c | PROH-W | Gumming solution | 6 | 8, no ink acceptance problem, no toning |
| 18 | Substrate 1 | S4d | Water | Gumming solution | 6 | 5, no ink acceptance problem, no toning |
| 19 | Substrate 1 | S5a | PROH-W | Gumming solution | 6 | 4, no ink acceptance problem, no toning |
| 20 | Substrate 1 | S5b | PROH-W | Gumming solution | 6 | 7, no ink acceptance problem, no toning |
| 21 | Substrate 1 | S5c | PROH-W | Gumming solution | 6 | 5, no ink acceptance problem, no toning |
| 22 | Substrate 1 | S5d | PROH-W | Gumming solution | 6 | 4, no ink acceptance problem, no toning |
| 23 | Substrate 1 | S5e | PROH-W | Gumming solution | 6 | 6, no ink acceptance problem, no toning |
| 24 | Substrate 1 | S5f | PROH-W | Gumming solution | 6 | 7, no ink acceptance problem, no toning |
| 25 | Substrate 1 | S5g | Water | Gumming solution | 6 | 7, no ink acceptance problem, no toning |
| 26 | Substrate 1 | S5h | PROH-W | Gumming solution | 6 | 5, no ink acceptance problem, no toning |
| 27 | Substrate 1 | S5i | PROH-W | Gumming solution | 6 | 6, no ink acceptance problem, no toning |
| 28 | Substrate 1 | none | PROH-W | S1a + Gumming solution | 6 | 11, no ink acceptance problem, no toning |
| 29 | Substrate 1 | none | PROH-W | S1b + Gumming solution | 6 | 10, no ink acceptance problem, no toning |
| 30 | Substrate 1 | none | PROH-W | S1c + Gumming solution | 6 | 12, no ink acceptance problem, no toning |
| 31 | Substrate 1 | none | PROH-W | S1d + Gumming solution | 6 | 13, no ink acceptance problem, no toning |
| 32 | Substrate 1 | none | Water | S2a + Gumming solution | 6 | 10, no ink acceptance problem, no toning |
| 33 | Substrate 1 | none | PROH-W | S3a + Gumming solution | 6 | 9, no ink acceptance problem, no toning |
| 34 | Substrate 1 | none | PROH-W | S3b + Gumming solution | 6 | 6, no ink acceptance problem, no toning |

TABLE 7-continued

| Example | Substrate | Post-treatment[1)] | Solvent[2)] | Finishing[3)] | Sensitivity[4)] | Relative dot gain (relative area)[5)] and other printing behavior |
|---|---|---|---|---|---|---|
| 35 | Substrate 1 | none | PROH-W | S3c + Gumming solution | 6 | 12, no ink acceptance problem, no toning |
| 36 | Substrate 1 | none | PROH-W | S3d + Gumming solution | 6 | 11, no ink acceptance problem, no toning |
| 37 | Substrate 1 | none | Water | S3e + Gumming solution | 6 | 10, no ink acceptance problem, no toning |
| 38 | Substrate 1 | none | Water | S3f + Gumming solution | 6 | 9, no ink acceptance problem, no toning |
| 39 | Substrate 1 | none | PROH | S3g + Gumming solution | 6 | 8, no ink acceptance problem, no toning |
| 40 | Substrate 1 | none | PROH | S3h + Gumming solution | 6 | 13, no ink acceptance problem, no toning |
| 41 | Substrate 1 | none | PROH | S4a + Gumming solution | 6 | 12, no ink acceptance problem, no toning |
| 42 | Substrate 1 | none | PROH | S4b + Gumming solution | 6 | 14, no ink acceptance problem, no toning |
| 43 | Substrate 1 | none | PROH | S4c + Gumming solution | 6 | 14, no ink acceptance problem, no toning |
| 44 | Substrate 1 | none | PROH | S4d + Gumming solution | 6 | 12, no ink acceptance problem, no toning |

Footnotes for Table 7

1)"Posttreatment" means that the developed plate was treated with a 2 wt.-% solution of the listed polymer.

2)The listed solvent was used for the solution used for the posttreatment.

3)"Finishing" means that this was the final treatment step of the printing plate; either a gumming solution 850S ® from Kodak Polychrome Graphics or a mixture of 1 part by volume of this gumming solution and 1 part by volume of a 2 wt.-% solution of the listed hydrophilic polymer in the solvent listed under "solvent" was used.

4)Steps of an UGRA Offset test scale 1982 obtained in a fresh plate developed after exposure.

5)The relative dot gain was calculated using equation (2) above.

Example 45 and Comparative Example 4

The substrate of Table 8 was coated with the formulation described in Table 6 and provided with an overcoat layer as described in Examples 1 to 44. Then, the plate was exposed with a Heidelberg Prosetter equipped with a diode emitting at 405 nm (P=30 mW). The test image was exposed onto the plate at a resolution of 2540 dpi in a 20μ FM screen (Heidelberg Diamond). The plate was then developed with an alkaline developer as described analogously in Examples 1 to 44 and then subjected to a finishing treatment; these two process steps were carried out in a commercially available processor. After 10,000 prints, the plate of Example 45 showed a much lower shift in the tonal values (see FIG. 3) than the plate of Comparative Example 4 (see FIG. 4).

TABLE 8

| Example | Substrate | Posttreatment | Finishing | Relative dot gain |
|---|---|---|---|---|
| Comp. 4 | Substrate 2 | none | Gumming 850 S | 100 |
| 45 | Substrate 1 | none | S4-d + Gumming 850 S[1)] | 15 |

1)1 part by volume of the gumming solution 850 S ® from Kodak Polychrome Graphics and 1 part by volume of a 4 wt.-% solution of the hydrophilic polymer S4-d were mixed in water It was observed that even small structural elements as they occur in the 20μ FM screen show a much more favorable behavior during printing in Example 45 than those in Comparative Example 4.

The invention claimed is:

1. Process for the production of a lithographic printing plate comprising (a) providing a lithographic substrate;

(b) applying at least one radiation-sensitive composition onto the substrate provided in step (a) and drying;

(c) image-wise irradiating the lithographic printing plate precursor obtained in step (b);

(d) removing the non-image areas from the image-wise exposed precursor by means of a developer solution;

(e) treating the lithographic printing plate obtained in step (d) with a solution comprising a hydrophilic copolymer comprising structural units derived from the following compounds:

(i) a compound comprising both polyalkylene oxide chains and at least one structural unit which is free-radical polymerizable, wherein the compound (i) is at least one compound selected from the group consisting of Poly(ethylene glycol) methacrylate, poly(ethylene glycol) acrylate, poly(propylene glycol) methacrylate, poly(propylene glycol) acrylate, monoesters of acrylic acid or methacrylic acid with block copolymers of ethylene oxide and/or propylene oxide, the reaction product of 2,4-toluene diisocyanate-terminated polyethylene glycol, polypropylene glycol, block copolymer of polyethylene glycol and polypropylene glycol or statistical poly(ethylene glycol-propylene glycol) copolymer with hydroxyalkyl acrylate or methacrylate or allyl alcohol, the monoreaction product of isocyanatoalkyl acrylate or methacrylate with polyethylene glycol, polypropylene glycol, block copolymer of polyethylene glycol and polypropylene glycol or statistical poly (ethylene glycol-propylene glycol) copolymer, and ester or ether derivatives of poly(alkylene glycol) acrylate and methacrylate and (ii) a monomer capable of copolymerizing with the free-radical polymerizable structural unit of (i) and furthermore comprising at least one acidic functional group with $pK_s$<5, wherein the acidic functional group can be present as a free acid group or in the form of a salt;

(f) drying.

2. Process according to claim 1, furthermore comprising (g) treating the lithographic printing plate obtained in step (f) with a gumming solution, or wherein the solution of the hydrophilic copolymer used in step (e) furthermore comprises a gumming agent.

3. Process according to claim 1 wherein the image-wise exposed lithographic printing plate precursor obtained in step (c) is heated prior to the treatment with the developer.

4. Process according to claim 1 wherein the hydrophilic copolymer is present in the solution in a concentration of 0.01 to 15 wt.-%.

5. Process according to claim 1 wherein the hydrophilic copolymer furthermore comprises structural units derived from a comonomer (iii) different from monomer (ii) and comprising at least one free-radical polymerizable group, which comonomer can be used to adjust the physical properties of the hydrophilic copolymer.

6. Process according to claim 1 wherein the monomer (ii) is at least one monomer selected from the group consisting of acrylic acid, methacrylic acid, crotonic acid, maleic acid anhydride ring-opened with a $C_1$-$C_6$ alkanol, vinylbenzoic acid, vinylphosphonic acid, vinylsulfonic acid, vinylbenzolsulfonic acid, monoesters of phosphoric acid with hydroxyalkyl(meth)acrylate or allyl alcohol and sulfopropyl (meth) acryloylethyldialkylammoniumhydroxide.

7. Process according to claim 5, wherein the comonomer (iii) is at least one comonomer selected from the group consisting of (meth)acrylamide, N-vinylpyrrolidone, hydroxyalkyl(meth)acrylate and allyl alcohol.

8. Process according to claim 1 wherein the structural units derived from (i) account for 5 to 95 wt.-%, the structural units derived from (ii) account for 5 to 95 wt.-% and the structural units derived from (iii) account for 0 to 50 wt.-%, each based on the total amount of structural units of the copolymer.

9. Process according to claim 1 wherein the hydrophilic copolymer was prepared by solvent polymerization in an ionic liquid.

10. Process according to claim 1 wherein the radiation-sensitive layer is a UV/VIS-sensitive layer sensitive to radiation from a wavelength selected from the range of 320 to 750 nm.

11. Process according to claim 1 wherein the radiation-sensitive layer is a layer sensitive to radiation from a wavelength selected from the range of more than 750 to 1,600 nm.

12. Process for the posttreatment of an imaged lithographic printing plate comprising (a) providing a lithographic printing plate comprising image areas and non-image areas on a lithographic substrate;

(b) bringing the lithographic printing plate of step (a) into contact with a solution comprising a hydrophilic copolymer as defined in claim 1;

(c) drying.

13. Process according to claim 12, wherein the printing plate obtained in step (c) is subsequently brought into contact with a gumming solution, or wherein the solution used in the step (b) furthermore comprises a gumming agent.

* * * * *

UNITED STATES PATENT AND TRADEMARK OFFICE

CERTIFICATE OF CORRECTION

PATENT NO. : 7,829,261 B2
APPLICATION NO. : 11/573916
DATED : November 9, 2010
INVENTOR(S) : Bernd Strehmel et al.

It is certified that error appears in the above-identified patent and that said Letters Patent is hereby corrected as shown below:

Title Page, Item 54,

Please delete "METHOD FOR MAKING A LITHOGRAPHIC PLATE" and insert --PROCESS FOR THE PRODUCTION OF A LITHOGRAPHIC PRINTING PLATE--, therefore.

Signed and Sealed this
Eighteenth Day of January, 2011

David J. Kappos
*Director of the United States Patent and Trademark Office*

UNITED STATES PATENT AND TRADEMARK OFFICE

CERTIFICATE OF CORRECTION

PATENT NO. : 7,829,261 B2
APPLICATION NO. : 11/573916
DATED : November 9, 2010
INVENTOR(S) : Bernd Strehmel et al.

It is certified that error appears in the above-identified patent and that said Letters Patent is hereby corrected as shown below:

Title Page, Item 54, and at Column 1, lines 1 and 2, Title

Please delete "METHOD FOR MAKING A LITHOGRAPHIC PLATE" and insert --PROCESS FOR THE PRODUCTION OF A LITHOGRAPHIC PRINTING PLATE--, therefore.

This certificate supersedes the Certificate of Correction issued January 18, 2011.

Signed and Sealed this
Fifteenth Day of February, 2011

David J. Kappos
*Director of the United States Patent and Trademark Office*